United States Patent [19]

Maeda et al.

[11] Patent Number: 4,544,642
[45] Date of Patent: Oct. 1, 1985

[54] SILICON CARBIDE ELECTRICAL INSULATOR MATERIAL OF LOW DIELECTRIC CONSTANT

[75] Inventors: Kunihiro Maeda; Tadahiko Miyoshi, both of Hitachi, Japan

[73] Assignee: Hitachi, Ltd., Tokyo, Japan

[21] Appl. No.: 373,261

[22] Filed: Apr. 29, 1982

[30] Foreign Application Priority Data

Apr. 30, 1981 [JP] Japan ................................. 56-64152

[51] Int. Cl.$^4$ ....................... C22C 29/00; C04B 35/56
[52] U.S. Cl. ..................................... 501/88; 428/620; 428/627; 501/89; 501/90
[58] Field of Search ............... 501/88, 89, 90; 106/44; 428/620, 627

[56] References Cited

U.S. PATENT DOCUMENTS

| | | | |
|---|---|---|---|
| 4,172,109 | 10/1979 | Smoak | 501/88 |
| 4,326,039 | 4/1982 | Kriegesmann et al. | 501/88 |
| 4,370,421 | 1/1983 | Matsushita et al. | 501/88 |
| 4,374,793 | 2/1983 | Koga et al. | 501/88 |

*Primary Examiner*—Veronica O'Keefe
*Attorney, Agent, or Firm*—Antonelli, Terry & Wands

[57] ABSTRACT

A silicon carbide electrical insulator material of low dielectric constant comprising an electrically insulating sintered body containing silicon carbide as a main constituent and an element providing electrical insulating properties in sintered state, wherein the sintered body comprises an element selected from V family in the periodic table and the carrier concentration within the crystal grain of silicon carbide is $5 \times 10^{17}$ cm$^{-3}$ or less.

11 Claims, 7 Drawing Figures

SILICON CARBIDE ELECTRICAL INSULATOR MATERIAL OF LOW DIELECTRIC CONSTANT

This invention relates to a novel silicon carbide electrical insulator material and more particularly to a silicon carbide electrical insulator material having a low dielectric constant and a manufacturing method therefor.

In recent years, semiconductor industry has made great progress and density of circuit component elements formed on an insulating substrate used for a large scale integrated circuit and the like has been increasing more and more. In addition, demand for miniaturization is urgent and high heat dissipation characteristic is demanded of insulators used. Thus, desirable properties to be owned by the insulating substrate are:

(1) large electrical insulation,
(2) large thermal conductivity,
(3) thermal expansion coefficient close to that of silicon,
(4) large mechanical strength, and
(5) surface smoothness.

U.S. Patent application Ser. No. 203,554 filed on Nov. 5, 1980, now U.S. Pat. No. 4,370,421, and assigned to the same assignee as the present application discloses as a material satisfying the above requirements, a sintered material of silicon carbide containing BeO which substitutes for an alumina insulator material. This sintered material has extremely excellent characteristics at room temperature including an electrical resistivity of $10^7 \Omega\cdot\text{cm}$ or more, a thermal conductivity of 0.4 cal/cm·sec·°C. or more, a thermal expansion coefficient of 3 to $4\times10^{-6}$/°C. and a bending strength of 60 kg/mm² or more. However, this sintered material of silicon carbide containing BeO has a large dielectric constant value of about 80 to 400 (at 1 kHz) and is found unsuitable for use as substrates of various electronic apparatus and circuits which are operated in a high frequency region of relatively high frequencies.

An object of this invention is to provide a silicon carbide electrical insulator material of low dielectric constant and a manufacturing method therefor.

Another object of this invention is to provide a semiconductor device of high heat dissipation using a substrate made of the silicon carbide insulator material.

According to one aspect of this invention, there is provided a silicon carbide electrical insulator material of low dielectric constant comprising an electrically insulating sintered material containing silicon carbide as a main constituent and an element providing electrical insulating properties in sintered state, wherein the sintered material comprises an element selected from V family in the periodic table and the carrier concentration within the crystal grain of silicon carbide is $5\times10^{17}$ cm$^{-3}$ or less.

Preferably, the sintered material contains silicon carbide by 85 weight % or more to thereby obtain high thermal conductivity and low thermal expansion coefficient.

The element providing electrical insulating properties comprises BN or Be, preferably, Be and the sintered material containing Be exhibits high thermal conductivity. Metallic Be and a Be compound such as Be oxide, Be carbide or Be nitride may be used as Be. Another Be compound which, when subjected to pyrolysis, creates the aforementioned Be compound may also be used.

The latter Be compound is added in the form of liquid to thereby make the dispersion of Be uniform.

The Be content is preferably 0.1 to 3.5 weight %. By adding this quantity of Be, a sintered material can be obtained which has an electrical resistivity of $10^7 \Omega\cdot\text{cm}$ or more and a thermal conductivity of 0.4 cal/cm·sec·°C. or more at room temperature. In order to obtain a density of 95% or more of the theoretical density, the Be content is preferably 0.1 weight % or more. On the other hand, when a sintered material is used for an insulating substrate of a semiconductor device using silicon elements, the sintered material is desired to have a thermal expansion coefficient at room temperature close to that of the silicon element and to this end, addition of 3.5 weight % or less of Be in preferable.

While minor part of Be content providing electrical insulating properties enters the crystal grain of silicon carbide, major part thereof is found among the grains of silicon carbide in the sintered material, creating various energy levels. Part of Be content entrained in the crystal grain acts as acceptor and the crystal grain becomes a p-type semiconductor having a low electrical resistivity of about 0.3 to 2.0 $\Omega\cdot\text{cm}$. On the other hand, carriers within the grain are partly captured by the energy levels created at the grain boundary so that, within crystal grains on both sides of the grain boundary, depletion layers of carrier are created which are contiguous to the grain boundary. These depletion layers act as electrical barriers which contribute to electrical insulating properties. On the other hand, since silicon carbide is a covalence bond crystal, its crystal per se has a large thermal conductivity and its single crystal has a thermal conductivity of about 0.4 to 1.2 cal/cm·sec·°C. However, silicon carbide sintered materials conventionally known typically have a thermal conductivity of 0.1 to 0.3 cal/cm·sec·°C. which is smaller than that of the single crystal of silicon carbide. Supposedly, this is because phonons playing the leading part in heat conduction in silicon carbide are scattered at the grain boundary of the sintered material. On the contrary, in the silicon carbide sintered material of this invention exhibiting high heat conduction and electrical insulating properties, BeO of high heat conductivity present at the grain boundary suppresses scattering of phonons at the boundary and hence the material, for all the sintered one, exhibits high heat conduction properties comparable to those of the single crystal.

With the sintered material, voltage applied thereto is almost localized to the high resistance depletion layer adjacent to the grain boundary. The width of the depletion layer is very thin as compared to the crystal grain size. This accounts for the fact that while the crystal grain per se has a small dielectric constant of about 10, the sintered material has a very large apparent dielectric constant of 80 to 400. The relation between dielectric constant and depletion layer width of the sintered material is expressed by, $$\epsilon_s = \epsilon_G \cdot d/2t_D \tag{1}$$

where $\epsilon_s$ is specific dielectric constant of the sintered material, $\epsilon_G$ is specific dielectric constant of the silicon carbide crystal grain per se, d is silicon carbide crystal grain size and $t_D$ is width of the depletion layer.

In order to reduce the specific dielectric constant of the BeO containing sintered material, as will be seen from equation (1), it is necessary to increase the width $t_D$ of the depletion layer sustaining electric field, which width is given by, $$t_D = (2\epsilon_0\epsilon_G\phi_B/ne^2)^{\frac{1}{2}} \quad (2)$$

where $\epsilon_0$ is dielectric constant of vacuum, $\phi_B$ is height of electrical barrier due to the depletion layer, n is carrier concentration in the silicon carbide crystal grain, and e is electric charge of electron.

Equation (2) shows that the depletion layer width $t_D$ is proportional to $(\phi_B/n)^{\frac{1}{2}}$. However, the height of barrier $\phi_B$ is in general a function of the carrier concentration n, and it gradually decreases as the n increases and rapidly decreases with the carrier concentration being in excess of a predetermined value. From the above discussion, it will be seen that the dielectric constant of the sintered material can be reduced by decreasing the carrier concentration to increase the width of the depletion layer.

When powdery particles prepared by pulverizing silicon carbide produced through Acheson process are sintered, a silicon carbide sintered material or body thus manufactured exhibits n-type conduction since such a raw material contains nitrogen which acts as donors in the silicon carbide. In order to obtain a sintered body of high thermal conduction properties, it is essential that the sintered body has a density of 95% or more of the theoretical density. According to the BeO containing sintered body of this invention, the Be out of BeO entered in the crystal grain acts as acceptors which excessively compensate for donors in the powdery particles of raw material, on condition that sintering condition meets a temperature of 1950° C. or more and a pressure of 100 kg/cm² or more which are sufficient to assure the density of the sintered body that is 95% or more of the theoretical density. Thus, the crystal grain becomes a p-type semiconductor of excessive acceptors. In this case, the carrier concentration n within the grain is, $$n = |n_A - n_D| \quad (3)$$

where $n_D$ is donor concentration and $n_A$ is acceptor concentration.

The inventors of the present invention added BeO and an additional element selected from Va and Vb families in the periodic table having an ion valence of +5 to various kinds of silicon carbide raw powdery particle having different nitrogen content concentrations, and sintered the silicon carbide raw material with the additives. By using the thus prepared BeO containing silicon carbide sintered materials having different carrier concentrations within the crystal grain of silicon carbide, the relation between carrier concentration n and specific dielectric constant $\epsilon_s$ of the sintered body was examined. Results showed that sintered body without containing an element of V family has a carrier concentration within the grain n of about $9 \times 10^{17}$ to $5 \times 10^{18}$ cm$^{-3}$ and a specific dielectric constant of the sintered body $\epsilon_s$ of 80 to 400. With a carrier concentration n of $5 \times 10^{17}$ cm$^{-3}$ or less as taught by the present invention, sintered body of this invention were found to have a specific dielectric constant $\epsilon_s$ of 30 or less which is $\frac{1}{3}$ to 1/10 of that of the conventional sintered body.

The carrier concentration within the crystal grain can be determined by measuring capacitance of the sintered body and height $\phi_B$ of the depletion layer barrier. Assuming that capacitance per unit area and unit thickness of the sintered body is c, from equations (1) and (2), the carrier concentration n is, $$n = 8\phi_B C^2/\epsilon_0\epsilon_G e^2 d^2 \quad (4).$$

By measuring temperature dependent changes in resistivity of the sintered body within a small current region, the barrier height $\phi_B$ can be determined in terms of the activation energy of the barrier.

From the standpoint of the additive for controlling the carrier concentration within the crystal grain, either element of Nb, N, P As, Sb or Bi selected from Va and Vb families acts as donor of equivalent efficiency. Elements of V and Ta are relatively ineffective. If the total amount of the element to be contained in the sintered body is in excess of 0.5 mol %, scattering of phonons within the crystal grain will be increased to thereby adversely degrade the heat conduction. Conversely, with a total amount of 0.005 mol % or less, almost no controlling effect is expected.

Thus, according to another aspect of this invention, there is provided a method of manufacturing a silicon carbide electrical insulator material of a low dielectric constant comprised of a sintered material containing silicon carbide as a main constituent, wherein a powdery mixture of powdery particles of silicon carbide, powdery particles of an element providing electrical insulating properties in sintered state, powdery particles of an element selected from V family of the periodic table with an amount of addition which provides a carrier concentration within the crystal grain of $5 \times 10^{17}$ cm$^{-3}$ or less in sintered state, silicon varnish and an organic solvent is molded under pressure, and a resulting molded material is sintered by hot pressing.

In accordance with the manufacturing method of this invention, a silicon carbide sintered body of high electrical insulation can be obtained. Silicon varnish containing Si reacts with carbon (C) in the organic solvent added as a binder to form silicon carbide and supposedly, this accounts for the fact that the resulting sintered body exhibits electrical insulating properties. According to study conducted by the inventors of the present invention, carbon in the binder is proven to terribly impair electrical insulating properties of the sintered body. Supposedly, therefore, the silicon resin allows carbon in the binder to react with Si so as to considerably reduce the amount of freed carbon in the sintered body.

The mixed silicon varnish and organic solvent shares halves by volume. This binder is mixed with the powdery particle by 10 to 30 weight %, so that the mixture can be hardened by gripped hand. Preferably, the mixed powdery particles added with the binder is molded under pressure at room temperature and thereafter sintered by hot pressing. Preferably, in hot-press sintering, pressure to be applied at high temperatures is applied at room temperature and temperature is raised from room temperature to a predetermined high temperature which is maintained.

In alternative, the silicon resin and organic solvent may be added to the mixed powdery particles to form sludge, and the sludge is sprayed and granulated within a drying chamber into about 10 μm sized powdery particles which in turn are molded under pressure as described above.

According to still another aspect of this invention, there is provided a semiconductor device wherein semiconductor elements are directly carried on a substrate of an electrically insulating sintered body containing silicon carbide as a main constituent, an element providing electrical insulating properties in sintered state, and an element selected from V family of the periodic table, with the carrier concentration within the crystal grain of silicon carbide being $5 \times 10^{17}$ cm$^{-3}$ or less in sintered state.

Preferably, the substrate is formed with a metalized layer for example, a metal layer containing Mn and the semiconductor elements are brazed to the substrate through the metalized layer. In order that the sintered body of the present invention has a high electrical insulation property (more than $10^{10}$ Ω·cm at room temperature), silicon carbide has to contain, as impurities, 0.1 weight % or less of Al and 0.4 weight % or less of free C. For free C, the resultant sintered body must contain 0.4 weight % or less of free C which was originally contained in the silicon carbide and the binder, respectively.

The present invention will be apparent from the following detailed description taken in conjunction with the accompanying drawings, in which.

CONTROL EXAMPLE

Silicon carbide powdery particles of 20 μm average size was added with Be powdery particles of 10 μm or less average size by 2 weight % and mixed. Table 1 shows a chemical composition (weight %) of silicon carbide powdery particle used. The carrier concentration of the sintered body is adjusted by the control of nitrogen content in an atmosphere during the heat treatment at a temperature of about sintering temperature. This silicon carbide powdery particle is of an n-type semiconductor.

TABLE 1

| SiC | Ni | Fe | Ti | V | Cr | Na (ppm) | Free Si | Free C | SiO$_2$ |
|---|---|---|---|---|---|---|---|---|---|
| remainder | 0.030 | 0.089 | 0.14 | 0.050 | 0.021 | 90 | 0.57 | 0.08 | 1.4 |

Various kinds of powdery particle mixture of silicon carbide powdery particles containing different amounts of nitrogen and BeO powdery particles were added with 50 volume % silicone varnish and 50 volume % xylene by 20 weight % and mixed, and thereafter applied with a load of 1,000 kg/cm$^2$ to form a green body. The molded material was put in a graphite die and heated under the application of a load of 300 kg/cm$^2$ in vacuum of $10^{-3}$ to $10^{-6}$ Torr to form a sintered body. Temperature was raised from room temperature to 2,000° C. over two hours and maintained at 2,000° C. over one hour. The sintered body had a relative density of 99%, a silicon carbide carrier concentration of $9 \times 10^{17}$ to $5 \times 10^{18}$ cm$^{-3}$, and a specific dielectric constant of 80 to 400 at 1 kHz as shown at dotted line in FIG. 1. Within a temperature range of from room temperature to 300° C., it also had a thermal expansion coefficient of about $3.35 \times 10^{-6}$/°C., a heat conductivity of about 0.75 cal/cm·sec·°C., and an electrical resistivity of about $3 \times 10^{12}$ Ω·cm. In the sintered body, BeO of 0.50 weight % Be content was contained. The amount of Be contained in the silicon carbide crystal grain of the sintered body is very small, and its content has almost no dependency on the amount of Be contained in the sintered body and is determined by sintering temperature. The BeO in the sintered body is finely distributed at the grain boundary of silicon carbide. In examples to be described below, BeO is similarly distributed.

EXAMPLE 1

Figure 1:
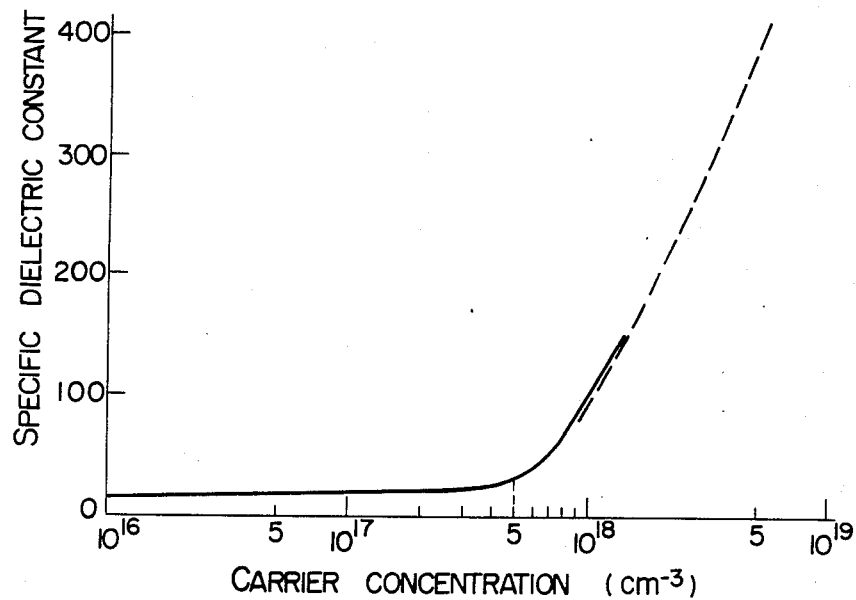
FIG. 1 is a graph showing the relation between carrier concentration within the crystal grain and specific dielectric constant of a BeO containing silicon carbide sintered body with an additive of Si$_3$N$_4$.

The powdery particle mixture used in the previous control example was added with Si$_3$N$_4$ powdery particles by 0.001 to 1.0 mol % and silicon varnish and xylene, and mixed. This mixture was molded and sintered under the same condition as the previous example to form a sintered body. The amount of N contained in the sintered body was limited to a range of from 0.0022 to 1.8 atm % and the carrier concentration within the silicon carbide grain of the sintered body was changed. Then, the crystal grain of silicon carbide is of a p-type semiconductor. Relative density and thermal examsion coefficient of the sintered body was almost unchanged when compared to the control example without the additive of Si$_3$N$_4$. Electrical resistivity at room temperature was $5 \times 10^{12}$ to $6 \times 10^{13}$ Ω·cm, exceeding that of the previous control example. FIG. 1 shows, at solid line, the relation between the carrier concentration within the grain of silicon carbide and the specific dielectric constant of the sintered body in this example. As will be seen FIG. 1, for a carrier concentration of $5 \times 10^{17}$ cm$^{-3}$ or less, a silicon carbide sintered material was obtained, having a low dielectric constant which corresponds to a specific dielectric constant of 30 or less at 1 kHz. The carrier concentration was determined by Hall coefficient measurement.

Figure 2:
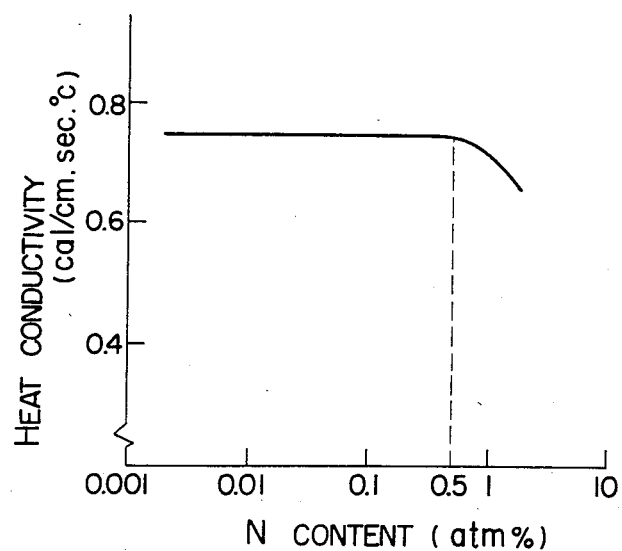
FIG. 2 is a graph showing the relation between N content in the silicon carbide sintered body and thermal conductivity.
Figure 3:
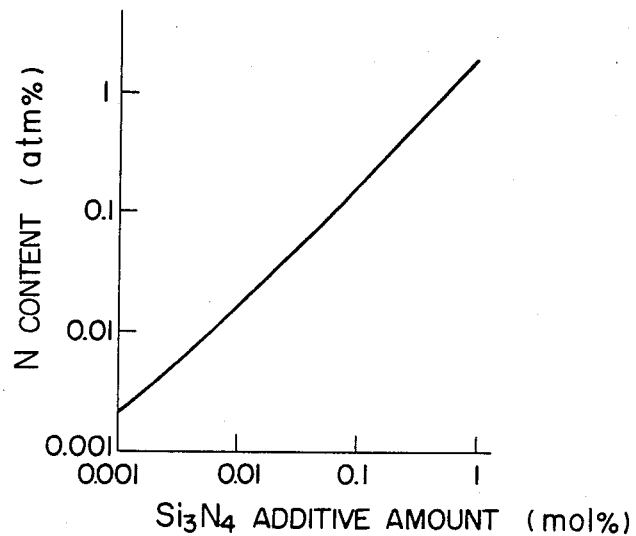
FIG. 3 is a graph showing the relation between additive amount of Si$_3$N$_4$ and N content in the silicon carbide sintered body.

The relation between the amount of N contained in the sintered body and heat conductivity was as shown in FIG. 2. As will be seen from FIG. 2, the thermal conductivity decreases as the N content exceeds 0.5 atm %. The carrier concentration was less affected by a carrier concentration of 0.005 atm % or less. FIG. 3 shows the relation between the amount of additive of Si$_3$N$_4$ and the N content in the sintered body.

EXAMPLE 2

Figure 4:
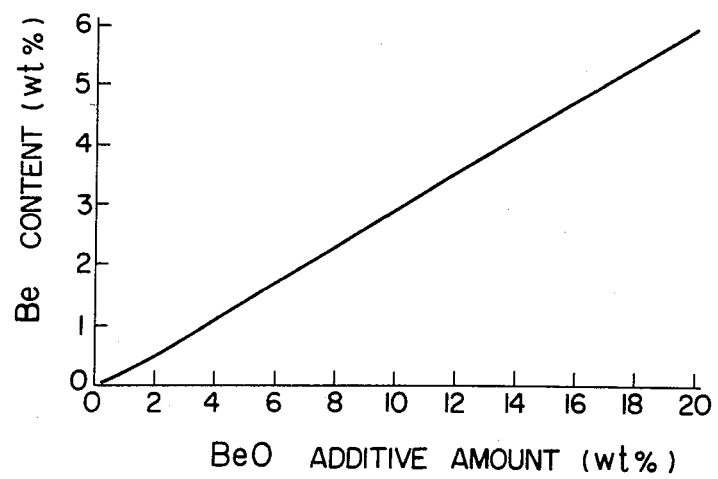
FIG. 4 is a graph showing the relation between additive amount of BeO and Be content in the sintered body.
Figure 5:
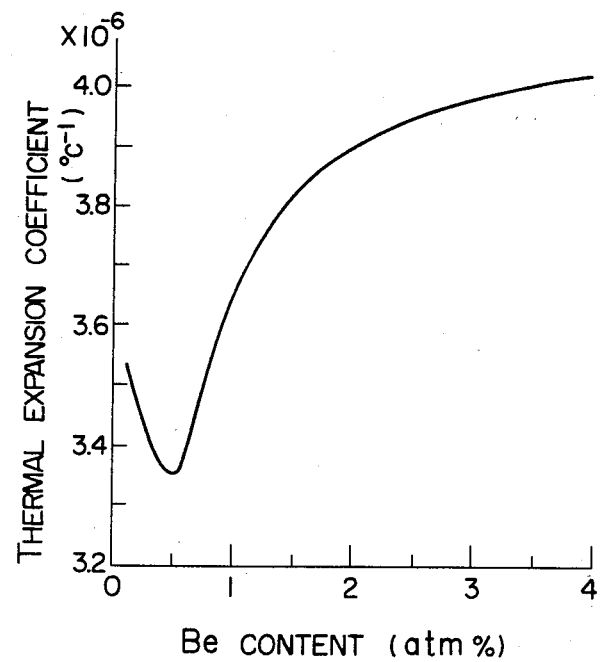
FIG. 5 is a graph showing the relation between Be content and thermal expension coefficient.

The same silicon carbide powdery particles as those of Example 1 were added with BeO powdery particles by 0.2 to 20 weight % and Si$_3$N$_4$ by 0.1 mol %. The powdery particle mixture was sintered by hot pressing as in Example 1 to form various kinds of sintered body. FIG. 4 shows the relation between the amount of additive of BeO and the Be content in the sintered body. FIG. 5 shows the relation between the BeO content in terms of the Be content and the thermal expansion coefficient. For the BeO content in terms of Be content being 3.5 weight % or less, the thermal expansion coefficient decreases below $4 \times 10^{-6}/°C$. When the BeO content in terms of Be content is less than 0.1 atm %, it is difficult to obtain a sintered material of high density. The crystal grain of the sintered body thus prepared was of a p-type semiconductor, and the sintered material had, like Example 1, a low specific dielectric constant of 30 or less at 1 kHz when the carrier concentration within the crystal grain was $5 \times 10^{17}$ cm$^{-3}$. All of the resulting sintered body had a thermal conductivity of 0.7 cal/cm·sec·°C. or more, a high density of 98% or more of the theoretical density and an electrical resistivity of $10^{12}$ Ω·cm or more, exhibiting high heat conduction and electrical insulating properties.

EXAMPLE 3

Figure 6:
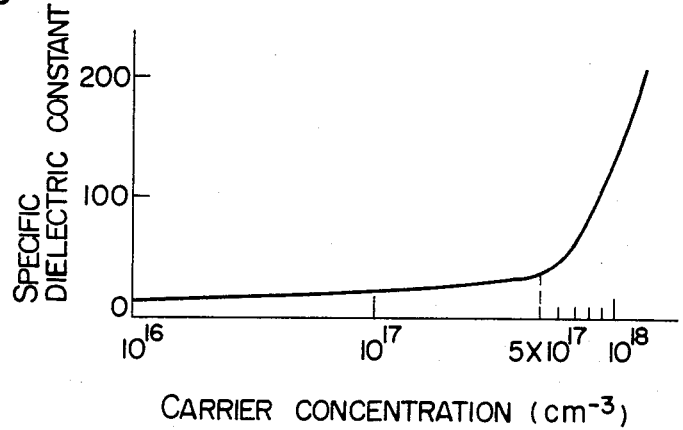
FIG. 6 is a graph showing the relation between carrier concentration within the crystal grain and specific dielectric constant of a BeO containing silicon carbide sintered body with an additive of P.

In this example, the additive of $Si_3N_4$ in Example 1 was replaced by a powdery particle mixture of SiC and BeO added with P by 0.005 to 1.0 atm %. A silicon carbide mixture with the above additive was sintered by hot pressing as in Example 1 to form a sintered body. The amount of P contained in the resulting sintered body was about 0.003 to 0.6 atm %. Especially, for the P content being 0.5 atm % or less, a sintered body having high heat conduction properties, as in Example 1, was obtained. The carrier concentration was less affected by the P content being 0.005 atm % or less. FIG. 6 shows the relation between the carrier concentration within the crystal grain and the specific dielectric constant in the thus prepared sintered body. Like Example 1, the sintered body had a low specific dielectric constant of 35 or less at 1 kHz when the carrier concentration was $5 \times 10^{17}$ cm$^{-3}$ or less, as will be seen from FIG. 6. In this example, the crystal grain was a p-type semiconductor. All of the resulting sintered body had a thermal expansion coefficient of 3.33 to $3.35 \times 10^{-6}/°C$., a density of 99% or more of the theoretical density, an electrical resistivity of $5 \times 10^{12}$ Ω·cm or more and a thermal conductivity of 0.6 cal/cm·sec·°C. or more at room temperature, exhibiting low thermal expansion, high electrical insulating and heat conduction properties.

EXAMPLE 4

In this example, the additive of P in Example 3 was placed with As, Sb, Bi, V, Nb or Ta by 0.005 to 1.0 atm %. A silicon carbide mixture with the above additive was sintered by hot pressing as in Example 1 to form a sintered body. The resulting sintered body had high heat conduction properties for the additive content being 0.5 atm % or less. The carrier concentration was less affected by the additive content being 0.005 atm % or less. The crystal grain was of a p-type semiconductor, and a considerable decrease in the dielectric constant of the sintered material was proven for the carrier concentration within the grain being $5 \times 10^{17}$ cm$^{-3}$ or less. The thus prepared sintered body had an electrical resistivity of $5 \times 10^{12}$ Ω·cm or more at room temperature, a thermal expansion coefficient of 3 to $4 \times 10^{-6}/°C$., and a thermal conductivity of 0.6 cal/cm·sec·°C. or more at room temperature. Of the aforementioned additives, V and Ta had less influence on the carrier concentration within the grain than the other additives.

EXAMPLE 5

In this example, the additive was a combination of two or more elements such as N-P, P-As, As-Sb, Bi-V, Nb-Ta, N-P-As or N-P-Bi added by 0.005 to 1.0 atm % in total, with the remaining constituent corresponding to that of Example 1, 3 or 4. A silicon carbide mixture with the above additive was sintered by hot pressing as in the previous examples to form a sintered body. The resulting sintered body had high heat conduction properties for the total additive content being 0.5 atm % or less. The carrier concentration was less affected by the additive content being 0.005 atm % or less. The crystal grain was of a p-type semiconductor, and the sintered body had a low dielectric constant of 30 or less at 1 kHz for the carrier concentration being $5 \times 10^{17}$ cm$^{-3}$ or less. The sintered body had electrical resistivity, thermal expansion coefficient and thermal conductivity which are comparable to those of Example 4.

EXAMPLE 6

To describe a specific application of the silicon carbide sintered body according to the invention, a semiconductor power module will be described which uses a substrate of the silicon carbide sintered body manufactured in the same manner as the previous control example and containing BeO of 0.5 weight % Be content and 0.1 mol % $Si_3N_4$.

The substrate of the silicon carbide sintered body provided by the present invention has an electrical resistivity of $10^{12}$ Ω·cm or more at room temperature, a thermal conductivity of about 0.7 cal/cm·sec·°C. at room temperature, a density of 98% or more of the theoretical density, a thermal expansion coefficient of $4 \times 10^{-6}/°C$. near room temperature and a specific dielectric constant of 30 or less at 1 kHz.

Figure 7:
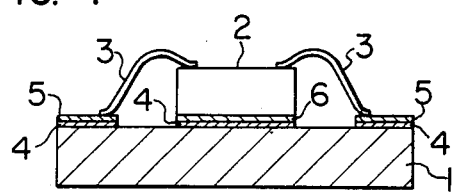
FIG. 7 is a sectional view showing a semiconductor device using the silicon carbide sintered body according to the invention.

FIG. 7 shows, in sectional form, a silicon semiconductor power module assembly using an insulating substrate incorporating the invertion. The substrate, designated at 1, is formed with a metalized layer 4 to which a silicon semiconductor element 2 is directly bonded by brazing layer 6. Reference numeral 5 designates conductors and 3 bonding wires. The metalized layer of an alloy foil of 40 weight % Cu and Mn is bonded to the substrate under pressure at 880° C. to a thickness of 25 μm.

The semiconductor device of the above construction and a conventional silicon semiconductor device were subjected to a heat cycle in which temperature is first maintained at $-60°$ C. for 30 minutes, thereafter lowered to room temperature that is maintained for 5 minutes and raised to 125° C. that is maintained for 30 minutes. The conventional device wherein a metal support plate is carried on an alumina substrate and a spacer provided on the support plate to mitigate the difference in thermal expansion coefficient between the substrate and the semiconductor element formed thereon suffered from cracks created in the substrate and exfoliation of soldering through 20 heat cycles. In contrast the semiconductor device of the invention remained normal through 150 heat cycles.

As described above, the silicon carbide sintered body of this invention having a low specific dielectric constant of 35 or less can advantageously be applied to the insulating substrate of semiconductor devices.

We claim:

1. A silicon carbide electrical insulator material of low dielectric constant consisting essentially of an electrically insulating sintered body which consists essentially of 0.1 to 3.5 weight % of Be as an element providing electrical insulating properties, 0.005 to 0.5 mol % of at least one element selected from the group consisting of Nb, V, Ta, N, P, As, Sb and Pi, and a balance of silicon carbide, whereby the carrier concentration within the crystal grain of silicon carbide in said sintered body is not more than $5 \times 10^{17}$ cm$^{-3}$ and said sintered body has electrical resistivity of not less than $10^7$ Ω·cm at room temperature.

2. A silicon carbide electrical insulator material of low dielectric constant according to claim 1, wherein the content of silicon carbide is not less than 85 weight %.

3. A silicon carbide electrical insulating material of low dielectric constant according to claim 1, wherein the Be is in the form of metallic beryllium or a beryllium compound.

4. A silicon carbide electrical insulating material of low dielectric constant according to claim 3, wherein the beryllium compound comprises beryllium oxide or beryllium carbide.

5. A silicon carbide electrical insulating material of low dielectric constant according to claim 1, wherein the at least one element is selected from the group consisting of phosphorus, niobium, nitrogen, arsenic, antimony and bismuth.

6. A silicon carbide electrical insulating material of low dielectric constant according to claim 1, wherein the crystal grain of silicon carbide in the sintered body is a p-type semiconductor.

7. A silicon carbide electrical insulating material of low dielectric constant according to claim 1, wherein the sintered body has a density of at least 95% of the theoretical density of silicon carbide.

8. A silicon carbide electrical insulating material of low dielectric constant according to claim 1, wherein the sintered body has a heat conductivity at room temperature of 0.4 cal/cm·sec·°C.

9. A silicon carbide electrical insulating material of low dielectric constant consisting essentially of an electrical insulating sintered body consisting essentially of at least 85 weight % of silicon carbide, 0.1 to 3.5 weight % of beryllium in the form of a compound consisting of beryllium oxide and 0.005 to 0.5 mol % of at least one element selected from the group consisting of Nb, V, Ta, N, P, As, Sb, and Bi; said sintered body having a density of at least 95% of the theoretical density of silicon carbide, an electrical resistivity at room temperature of $10^9$ Ω·cm and a heat conductivity at room temperature of at least 0.4 cal/cm·sec·°C. and the concentration of carrier of acceptor within the crystal grain of silicon carbide is not greater than $5 \times 10^{17}$ cm$^{-3}$.

10. A silicon carbide electrical insulating material of low dielectric constant according to claim 9, wherein said sintered body exhibits a dielectric constant of not more than 35.

11. A silicon carbide electrical insulating material of low dielectric constant according to claim 1, wherein said sintered body exhibits a dielectric constant of not more than 35.

* * * * *